(12) United States Patent
Kim

(10) Patent No.: US 9,852,814 B1
(45) Date of Patent: Dec. 26, 2017

(54) RUPTURE CONTROL DEVICE AND SEMICONDUCTOR DEVICE TO IMPROVE YIELD

(71) Applicant: SK hynix Inc., Icheon-si, Gyeonggi-do (KR)

(72) Inventor: Kwi Dong Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/255,569

(22) Filed: Sep. 2, 2016

(30) Foreign Application Priority Data

Jun. 15, 2016 (KR) .................. 10-2016-0074490

(51) Int. Cl.
| | | |
|---|---|---|
| G11C 11/34 | (2006.01) | |
| G11C 29/00 | (2006.01) | |
| G11C 17/16 | (2006.01) | |
| G11C 17/18 | (2006.01) | |

(52) U.S. Cl.
CPC .............. *G11C 29/78* (2013.01); *G11C 17/16* (2013.01); *G11C 17/18* (2013.01)

(58) Field of Classification Search
None
See application file for complete search history.

(56) References Cited

U.S. PATENT DOCUMENTS

| 5,673,271 | A * | 9/1997 | Ohsawa | G11C 29/38 711/217 |
|---|---|---|---|---|
| 9,064,605 | B2 | 6/2015 | Yoon | |
| 9,190,175 | B2 | 11/2015 | Shim | |
| 2007/0070701 | A1 * | 3/2007 | Kim | G11C 8/08 365/185.19 |
| 2013/0227344 | A1 * | 8/2013 | Sohn | G06F 11/27 714/6.21 |
| 2014/0145766 | A1 * | 5/2014 | Lee | H03K 17/223 327/143 |

* cited by examiner

*Primary Examiner* — Harry W Byrne
*Assistant Examiner* — Sultana Begum
(74) *Attorney, Agent, or Firm* — William Park & Associates Ltd.

(57) ABSTRACT

A rupture control device may include an address control circuit configured to generate a rupture address in response to a first rupture command signal, a rupture mask signal and an external address, wherein the rupture address is generated according to whether the rupture mask signal is activated, and wherein an address and fuse data are compared, and a rupture mask signal indicating whether a fuse is ruptured is determined. Further, a fuse array configured to perform a rupture operation in response to the rupture address when a rupture enable signal is activated, and output the fuse data in response to a read enable signal.

16 Claims, 5 Drawing Sheets

RUPTURE CONTROL DEVICE AND SEMICONDUCTOR DEVICE TO IMPROVE YIELD

CROSS-REFERENCES TO RELATED APPLICATION

The present application claims priority under 35 U.S.C. §119(a) to Korean application number 10-2016-0074490, filed on Jun. 15, 2016, in the Korean Intellectual Property Office, which is incorporated herein by reference in its entirety.

BACKGROUND

1. Technical Field

Various embodiments relate to a rupture control device and a semiconductor device including the same, and more particularly, to a technology for performing a repair operation using a fuse.

2. Related Art

DRAM (Dynamic Random Access Memory) involves a plurality of memory cells arranged in a matrix shape. When a defect occurs in any one of the memory cells, the semiconductor memory device is discarded because the semiconductor memory device cannot perform a normal operation. The increase in integration density and operating speed of the semiconductor memory device raises the probability that a defective cell will occur.

The yield of DRAM may be expressed as the ratio of the number of normal chips to the total number of chips which determines a fabrication cost of DRAM. When defective cells are likely to occur, the yield inevitably decreases. Thus, research has recently been conducted on a method for efficiently repairing a defective cell, in order to improve the yield while increasing the integration density and operating speed of a semiconductor memory device.

Examples of a method for repairing a defective cell may include a technology using a repair circuit which replaces a defective cell with a redundancy cell. In general, the repair circuit includes redundancy columns/rows arranged in columns and rows each including a plurality of redundancy memory cells. The repair circuit selects a redundancy column/row in place of a column/row in which a defect occurred.

That is, when a row and/or column address designating a defective cell is inputted, a redundancy column/row is selected in place of a defective column/row of a normal memory cell bank.

In order to identify an address designating a defective cell, a plurality of cuttable fuses are installed and selectively cut to program the address of the defective cell.

A method for repairing a defective cell in DRAM may be divided into a method for repairing a defective cell at the wafer level, and a method for repairing a defective cell at the package level.

A method for repairing a defective cell at the wafer level entails replacing a defective cell with a redundancy cell after performing a test at the wafer level. Furthermore, a method for repairing a defective cell at the package level is to replace a defective cell with a redundancy cell at the package level after performing a test at the package level.

SUMMARY

Various embodiments are directed to a rupture control device capable of receiving information of a target fuse and fixing an operation of a rupture counter until a rupture operation is completed, thereby reducing the number of unnecessary rupture operations, and a semiconductor device including the same.

In an embodiment of the present disclosure, a rupture control device may include: an address control circuit configured to generate a rupture address in response to a first rupture command signal, a rupture mask signal and an external address, wherein the rupture address is generated according to whether the rupture mask signal is activated, and wherein an address and fuse data are compared, and a rupture mask signal indicating whether a fuse is ruptured is determined; and a fuse array configured to perform a rupture operation in response to the rupture address when a rupture enable signal is activated, and output the fuse data in response to a read enable signal.

In an embodiment of the present disclosure, a semiconductor device may include: a rupture control device configured to output fuse data in response to a read enable signal, fix a counting signal during an inactive period of a rupture mask signal indicating whether a fuse is ruptured, and consecutively perform a preset number of rupture operations on the same rupture address; and a normal cell array configured to perform a redundancy operation for a fail address during a repair operation in response to the fuse data.

BRIEF DESCRIPTION OF THE DRAWINGS

Features, aspects, and embodiments are described in conjunction with the attached drawings, in which.

DETAILED DESCRIPTION

Hereinafter, a rupture control device and a semiconductor device including the same according to the present disclosure will be described below with reference to the accompanying drawings through exemplary embodiments.

Figure 1:
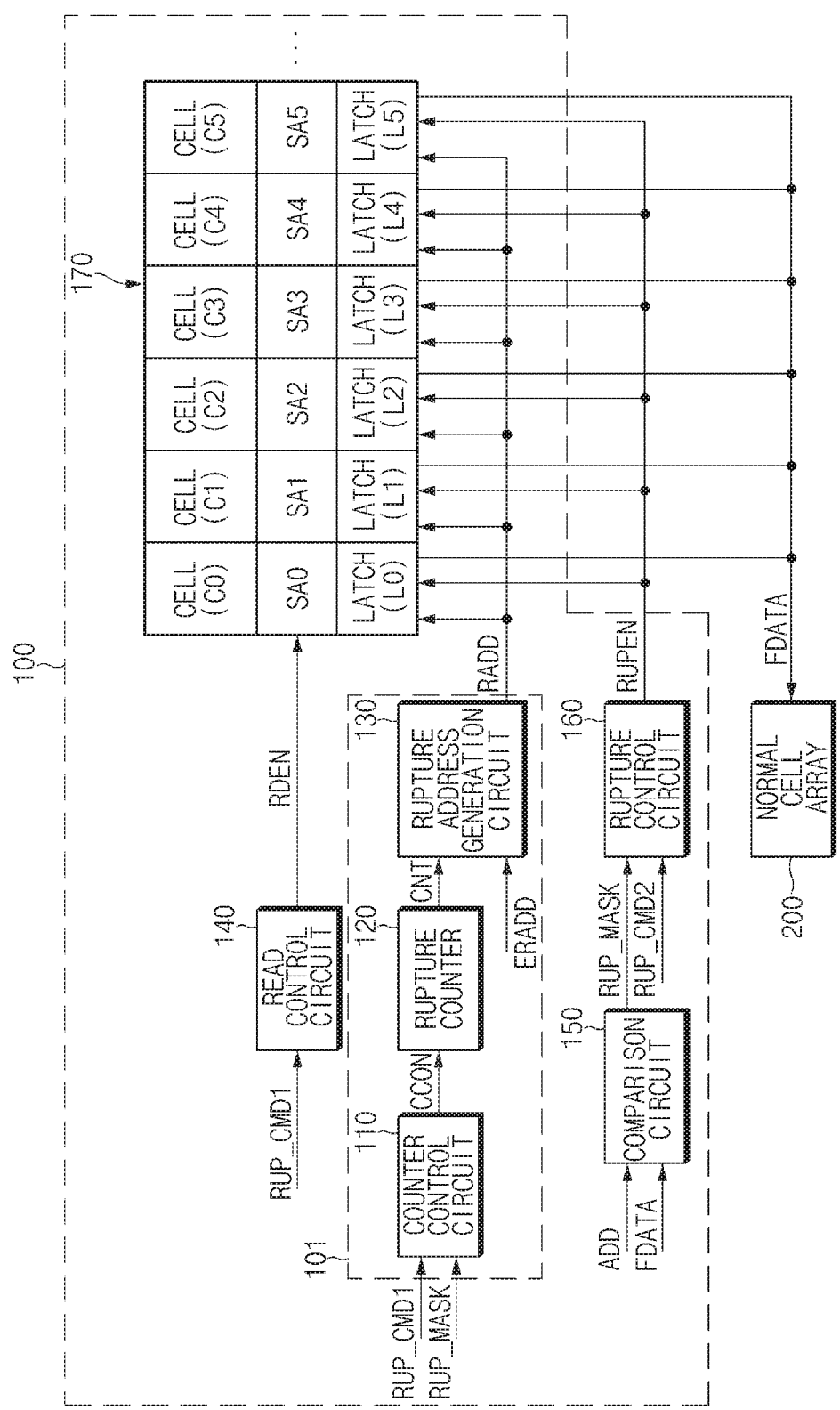
FIG. 1 is a configuration diagram of a semiconductor device according to an embodiment.

FIG. 1 is a configuration diagram of a semiconductor device according to an embodiment.

As illustrated in FIG. 1, a rupture control device 100 according to the present embodiment includes an address control circuit 101, a read control circuit 140, a comparison circuit 150, a rupture control circuit 160, a fuse array 170, and a normal cell array 200. The address control circuit 101 includes a counter control circuit 110, a rupture counter 120 and a rupture address generation circuit 130.

The rupture control device 100 controls a rupture operation of the fuse array 170 during a repair operation. For this operation, the address control circuit 101 controls whether to activate a rupture address RADD in response to a first rupture command signal RUP_CMD1, a rupture mask signal RUP_MASK, and an external address ERADD. In one example, the rupture address RADD is generated based on whether the rupture mask signal RUP_MASK is activated.

The counter control circuit 110 outputs a counter control signal CCON in response to the first rupture command signal RUP_CMD1 and the rupture mask signal RUP- _MASK. The rupture counter 120 performs a counting operation and outputs a counting signal in response to receiving the counter control signal CCON.

For example, the rupture counter 120 may either perform a counting operation in response to the logic level of the counter control signal CCON and activate the counting signal CNT, or stop the counting operation and deactivate the counting signal CNT.

The read control circuit 140 outputs a read enable signal RDEN in response to the first rupture command signal RUP_CMD1, where the read enable signal RDEN may be output for controlling a read operation. The first rupture command signal RUP_CMD1 is a command signal which is activated during a read operation. The read enable signal RDEN is activated in synchronization with the first rupture command signal RUP_CMD1.

The comparison circuit 150 compares an address ADD at which a rupture operation is to be performed to fuse data FDATA including fail bit information, and outputs the rupture mask signal RUP_MASK.

The address ADD includes the position of a fuse group and an address bit to rupture. The rupture mask signal RUP_MASK indicates whether the corresponding fuse was broken down, in other words ruptured, in response to information of the fuse data FDATA to rupture.

The rupture address generation circuit 130 receives an external address ERADD and generates a rupture address RADD in response to the counting signal CNT. The external address ERADD indicates address information of a fuse set, which is inputted from outside the rupture control device 100. The rupture address RADD indicates an address which is to be ruptured in the fuse array 170.

For example, the rupture address generation circuit 130 activates the rupture address RADD when both the counting signal CNT and the external address ERADD are activated. In the present embodiment, the rupture operation may be performed when the external address ERADD is activated to a high level. Furthermore, all external addresses ERADD may be sequentially activated to rupture all fuses.

The rupture control circuit 160 outputs a rupture enable signal RUPEN in response to the rupture mask signal RUP_MASK and a second rupture command signal RUP_CMD2. The second rupture command signal RUP_CMD2 is a command signal which is activated to control a rupture operation of a fuse, during a rupture operation. The second rupture command signal RUP_CMD2 may be inputted at a predetermined delay time after the first rupture command signal RUP_CMD1 is inputted.

The rupture enable signal RUPEN is used when rupturing a fuse of the fuse array 170 during a repair operation. The rupture enable signal RUPEN is activated when both the second rupture command signal RUP_CMD2 and the rupture mask signal RUP_MASK are activated.

The fuse array 170 performs a rupture operation on the rupture address RADD in response to receiving the rupture enable signal RUPEN, which in one example, is an active rupture enable signal RUPEN. The fuse array 170 outputs fuse data FDATA in response to the read enable signal RDEN.

The fuse array 170, in one example, includes a plurality of cells C0 to C5, a plurality of sense amplifiers SA0 to SA5, and a plurality of latches L0 to L5. The plurality of cells C0 to C5 may be set as a unit of one fuse set. The number of sense amplifiers SA0 to SA5, latches L0 to L5, and rupture addresses RADD may be set in response to the unit of the fuse set.

In the present embodiment, the number of cells C0 to C5, sense amplifiers SA0 to SA5, latches L0 to L5, and rupture addresses RADD are set to six. However, the present embodiment is not limited thereto, and the number can be changed according to the number of fuse sets.

The plurality of cells C0 to C5 may perform a rupture operation based on the rupture address RADD in response to the rupture enable signal RUPEN. The plurality of cells C0 to C5 may include an ARE (Array Rupture Electrical fuse).

Recently, the size of elements forming a semiconductor integrated circuit device has been reduced, and the number of elements included in one semiconductor chip has been significantly increased. Thus, the level of defect density has also increased. The increase of defect density serves as a direct factor in the reduction of the yield of a semiconductor device. When the defect density significantly increases, a wafer in which a semiconductor device is formed must be discarded.

In order to lower the defect density, a redundancy circuit for replacing a defective cell with a redundancy cell has been suggested. In the case of a semiconductor memory device, the redundancy circuit (or fuse circuit) may be installed in each of a row-related line (for example, word line) and a column-related line (for example, bit line).

The redundancy circuit includes the plurality of cells C0 to C5 for storing address information of a defective cell. The plurality of cells C0 to C5 may be implemented with a plurality of fuse sets including a plurality of fuse lines.

The plurality of cells C0 to C5 include memory which stores information on the addresses of all failed bits. The plurality of cells C0 to C5 select a row line corresponding to the rupture address RADD which is fuse selection information.

Each of the fuses sets program information by melting a fuse through an over-current. Furthermore, at the package level of the memory, self repair or rupture is performed in order to save a failed bit.

When a test of memory is ended, the fuse array 170 receives defect information of a memory cell and ruptures electrical fuses corresponding to respective bits of the defect information in the plurality of cells C0 to C5, in order to permanently store the fail information. At this time, the plurality of cells C0 to C5 performs a rupture operation in response to the rupture enable signal RUPEN applied from the rupture control circuit 160. In one particular example, a rupture operation for a fuse corresponding to a rupture address RADD may be performed in the plurality of cells C0 to C5 when the rupture enable signal RUPEN is activated.

The fuse array 170 stores address information of a defective cell through a rupture operation when the rupture enable signal RUPEN is activated. On the other hand, the fuse array 170 does not perform a rupture operation when the rupture enable signal RUPEN is deactivated. Each of the fuse sets may include E-fuses which program information by melting a fuse through an over-current.

The plurality of sense amplifiers SA0 to SA5 sense and amplify data stored in the plurality of cells C0 to C5. The plurality of sense amplifiers SA0 to SA5 read fuse data FDATA in response to the read enable signal RDEN, and output the read data to the normal cell array 200 when, for example, the read enable signal RDEN is activated. The plurality of latches L0 to L5 latch rupture addresses RADD for a predetermined time, the rupture addresses being inputted during rupture operations of the plurality of cells C0 to C5.

The normal cell array 200 performs a redundancy operation on a fail address in response to the fuse data FDATA applied from the fuse array 170, during a repair operation.

Figure 2:
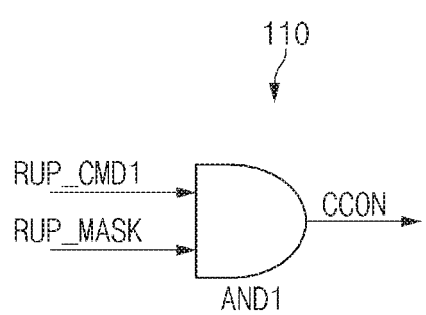
FIG. 2 is a detailed configuration diagram of a counter control circuit of FIG. 1.

FIG. 2 is a detailed configuration diagram of the counter control circuit 110 of FIG. 1.

The counter control circuit 110 activates the counter control signal CCON when at least one of the first rupture command signal RUP_CMD1 and the rupture mask signal RUP_MASK are activated. The counter control circuit 110 may include an AND gate AND1 which performs an AND operation on the first rupture command signal RUP_CMD1 and the rupture mask signal RUP_MASK, and the counter control circuit 110 outputs the counter control signal CCON.

For example, the counter control circuit 110 may output the counter control signal CCON at a high level when both the first rupture command signal RUP_CMD1 and the rupture mask signal RUP_MASK are enabled to a high level.

That is, the counter control circuit 110 outputs the counter control signal CCON in response to the level of the rupture mask signal RUP_MASK in a state where the first rupture command signal RUP_CMD1 is activated during a rupture operation. When the first rupture command signal RUP_CMD1 is at a high level, the counter control circuit 110 may output the rupture mask signal RUP_MASK at a high level. When the first rupture command signal RUP_CMD1 is at a low level, the counter control circuit 110 may output the rupture mask signal RUP_MASK at a low level.

Figure 3:
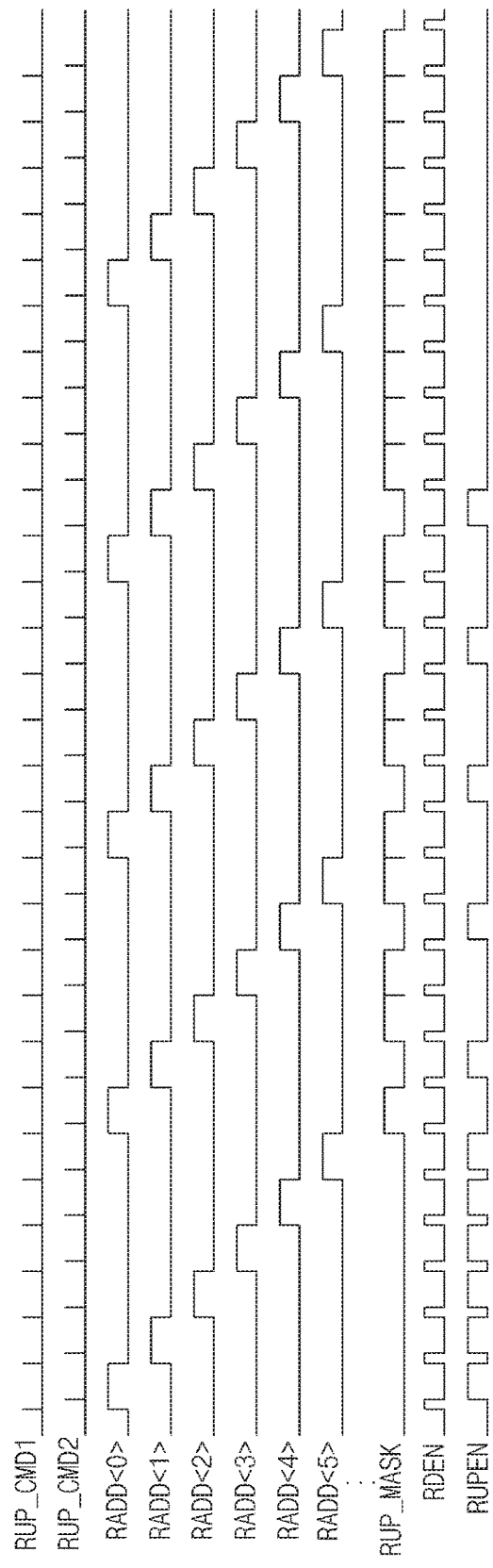
FIGS. 3 and 4 are operation timing diagrams for describing operation of a rupture control device according to the present embodiment.
Figure 4:
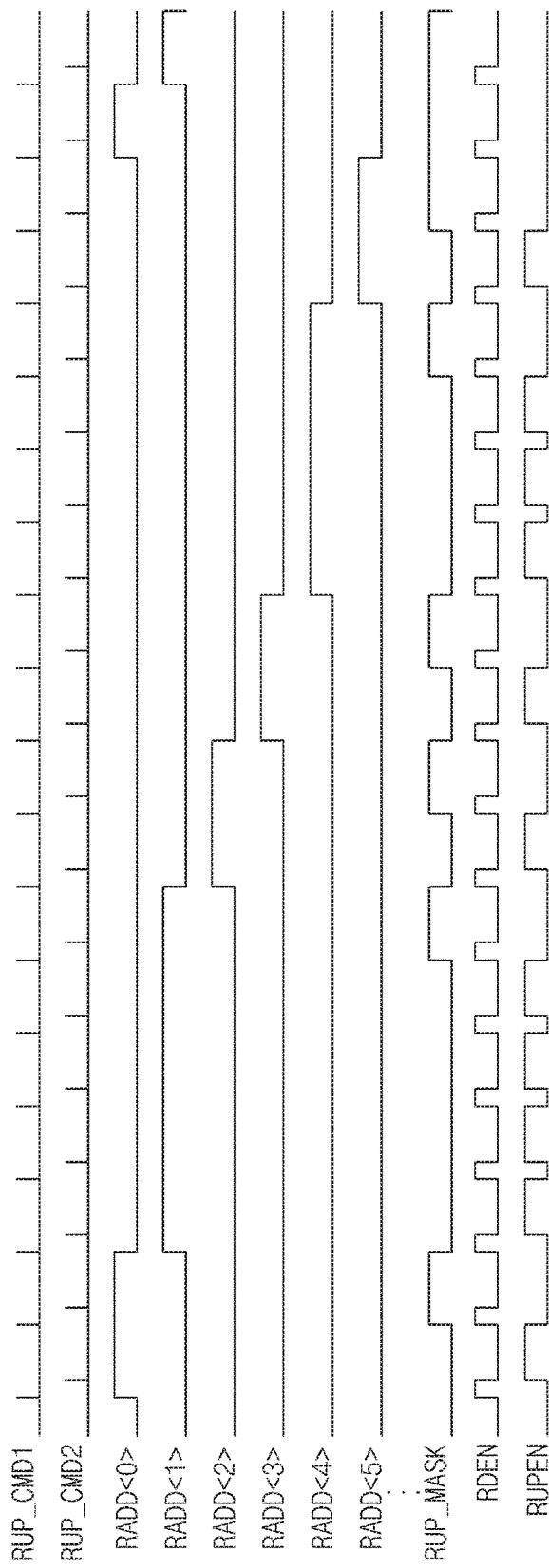

FIGS. 3 and 4 are operation timing diagrams for describing an operation of the rupture control device according to the present embodiment.

In the case of FIG. 3, the rupture control device receives one piece of fuse set information at a time, and sequentially ruptures the fuse set. Hereafter, operation of a general rupture control device will be schematically described. For example, the fuses of the cells C0, C2, C3 and C5 may be broken down and successfully ruptured through one rupture operation. On the other hand, the fuse of the cell C1 and the fuse of the cell C4 may be broken down and successfully ruptured through four rupture operations and three rupture operations, respectively.

In this case, rupture operations are sequentially performed on the fuses of the cells C0 to C5. When rupture operations are sequentially performed on the fuses of the cells C0 to C5 during a first rupture operation, the fuses of the cells C0, C2, C3 and C5 are ruptured, but the fuses of the other cells C1 to C4 are not ruptured.

During a second rupture operation, the rupture control device reads data on the fuses of the cells C0, C2, C3 and C5 which were previously ruptured in response to the first rupture command signal RUP_CMD1. Furthermore, the rupture control device checks which fuses were broken down in response to the rupture mask signal RUP MASK. For the completely ruptured fuses, the rupture control device masks the second rupture command signal RUP_CMD2 according to the rupture mask signal RUP MASK, such that a rupture operation is not performed on the previously ruptured fuses.

Such a process is continuously performed on all of the six fuses. All of the fuses are finally broken down at a fifth rupture operation after the fuse of the cell C1 and the fuse of the cell C4 are broken down through a fourth rupture operation and a third rupture operation. Then, the rupture operation is ended. In order to rupture all of the fuses, the rupture control device needs to perform the same rupture operation on all the six fuses.

That is, if the fuse of the cell C1 has the worst characteristic, the rupture control device needs to perform four rupture operations on each of the other fuses, in order to break down all of the fuses. When four rupture operations are performed on each of six fuses, 24 rupture operations need to be performed (6×4=24).

In this case, the rupture control device continuously operates the rupture counter 120 to sequentially rupture the rupture addresses RADD<0:5>. In such a general case, since the number of rupture operations is increased, the rupture control device requires a longer rupture time.

FIG. 4 is an operation timing diagram for describing an operation of the rupture control device according to the present embodiment.

When the first rupture command signal RUP_CMD1 is activated during a rupture operation, the read enable signal RDEN is activated. That is, when the first rupture command signal RUP_CMD1 is inputted, the rupture control device activates the read enable signal RDEN for reading fuse information of a cell which is to be ruptured in the fuse array 170. Then, the fuse information of the fuse array 170 is read such that the rupture control device outputs fuse data FDATA in response to the read enable signal RDEN.

At this time, only data of the sense amplifier corresponding to the fuse, for example, the sense amplifier SA0 may be outputted, and data of the other sense amplifiers SA1 to SA5 may not, in one example, be outputted. The rupture control device may check the fuse data FDATA to determine whether the corresponding cell was ruptured.

For this operation, the comparison circuit 150 compares the fuse data FDATA to an address ADD for selecting a fuse to rupture, and outputs the rupture mask signal RUP_MASK. For example, the comparison circuit 150 compares the address ADD and the fuse data FDATA, and activates the rupture mask signal RUP_MASK when the two values are equal to each other. Or, the comparison circuit 150 compares the address ADD and the fuse data FDATA, and deactivates the rupture mask signal RUP_MASK when the two values are different from each other.

When the corresponding cell to rupture is already ruptured, the comparison circuit 150 activates the rupture mask signal RUP_MASK such that a rupture operation is not performed on the corresponding fuse. On the other hand, when the corresponding cell to rupture is not ruptured, the comparison circuit 150 deactivates the rupture mask signal RUP_MASK in order to rupture the corresponding fuse.

While the rupture mask signal RUP_MASK is deactivated, an actual rupture operation is performed in response to the second rupture command signal RUP_CMD2. When the rupture mask signal RUP_MASK is activated, the rupture control circuit 160 deactivates the rupture enable signal RUPEN for enabling a rupture operation, so that a rupture operation is not performed.

That is, when the second rupture command signal RUP_CMD2 is activated, the rupture enable signal RUPEN needs to be activated in order to perform a rupture operation. However, during a period in which the rupture mask signal RUP_MASK is activated, the rupture control circuit 160 deactivates the rupture enable signal RUPEN such that a rupture operation is not performed.

When the first rupture command signal RUP_CMD1 is inputted after the second rupture command signal RUP_CMD2 is activated, the rupture control device operates the rupture counter 120 to shift a target fuse to the next address, thereby changing the rupture address ADD. At this time, the counter control circuit 110 according to the present embodiment activates the counter control signal CCON when at least one of the rupture mask signal RUP_MASK and first rupture command signal RUP_CMD1 are activated.

Thus, when the rupture mask signal RUP_MASK is activated, the count operation of the rupture counter 120 is stopped to fix the counting signal CNT to a predetermined level, for example, a logic high level. Then, the rupture address generation circuit 130 does not change the row address RADD in response to the counting signal CNT.

For example, as illustrated in FIG. 4, the row address RADD<0> is activated in response to the first rupture command signal RUP_CMD1. Then, during a period in which the second rupture command signal RUP_CMD2 is activated and the rupture mask signal RUP_MASK is deactivated, the rupture control circuit 160 deactivates the rupture enable signal RUPEN.

That is, during a period in which the rupture mask signal RUP_MASK is activated, the counter control signal CCON is activated to fix the output of the rupture counter 120. Thus, when the counting signal CNT is fixed, the rupture address generation circuit 130 does not shift the rupture address RADD to the next address.

Then, when the rupture mask signal RUP_MASK is deactivated and the next first rupture command signal RUP_CMD1 is inputted, the rupture address generation circuit 130 activates the next rupture address RADD<1>.

In the present embodiment, the rupture counter 120 does not operate unconditionally, but the counter control circuit 110 controls the operation of the rupture counter 120 using the rupture mask signal RUP_MASK indicating whether to perform a rupture operation, in order to reduce the number of rupture operations.

That is, when the rupture mask signal RUP MASK is activated and a fuse was not broken down, the counter control circuit 110 receives a deactivated counter control signal CCON and the counter control circuit 110 controls the rupture counter 120 so that the counting operation is stopped.

The counter control circuit 110 combines the rupture mask signal RUP_MASK and the first rupture command signal RUP_CMD1, and performs masking such that the first rupture command signal RUP_CMD1 is not inputted to the rupture counter 120 when the rupture mask signal RUP_MASK is at a low level indicating that the fuse was not broken down.

When a target fuse to rupture is not broken down even though the first rupture command signal RUP_CMD1 is inputted from outside, the counter control circuit 110 outputs the rupture mask signal RUP_MASK as the counter control signal CCON at a low level.

Thus, since the rupture counter 120 does not perform a counting operation, the value of the counting signal CNT is not increased and the counting signal CNT is deactivated and a preset number of rupture operations are attempted on the same rupture address RADD. After a preset number of rupture operations are performed on the same rupture address RADD during an inactive (i.e., deactivated) period of the rupture mask signal RUP_MASK, a rupture operation is performed on the next rupture address RADD. Such an operation is repeated until the fuse break down is completed and the rupture mask signal RUP_MASK becomes a high level.

For example, when a first rupture operation is started, the first rupture command signal RUP_CMD1 is applied, and the read enable signal REDN is activated to read fuse information on a fuse to rupture. Since all fuses are not broken down at the initial stage, the rupture operation is performed on all of the fuses.

Since the fuse of the cell C0 is broken down through only one rupture operation, the fuse of cell C0 is ruptured during the first rupture operation. However, when the second first rupture command signal RUP_CMD1 is inputted, the break-down state of the fuse is read at the same rupture address RADD<0> because the rupture mask signal RUP_MASK is deactivated.

The fuse of the first cell C0 was already broken down during the first rupture operation. Therefore, since the rupture mask signal RUP_MASK is activated and the rupture enable signal RUPEN changes to a low level, a rupture operation is not performed.

Then, when the first rupture command signal RUP_CMD1 is inputted again, the rupture mask signal RUP_MASK is deactivated, and the rupture counter 120 operates. Thus, the break-down state of the next rupture address RADD<1> is read to attempt a rupture operation on the rupture address RADD<1>.

In the case of the rupture address RADD<1>, the fuse is physically broken down through four rupture operations. Thus, the fuse information is read in response to the fifth first rupture command signal RUP_CMD1 after the rupture address RADD<1> was inputted. The break-down state of the fuse of the cell C1 is checked in response to the read enable signal RDEN. Then, the next rupture address RADD<2> is inputted in response to the next first rupture command signal RUP_CMD1. Such an operation is sequentially performed until the last rupture address RADD<5> is encountered.

In the present embodiment, the rupture control device needs to previously check information on how many rupture operations are performed until each fuse is physically broken down, during a rupture operation. The information on the number of rupture operations for the fuse may be previously secured through a cell characteristic test.

In the present embodiment, the rupture control device may perform only a total of 17 rupture operations until the fuses corresponding to all of the rupture addresses RADD<0:5> are broken down, through the above-described process. As the number of rupture addresses is increased, the break-down time for all fuses is further reduced.

Figure 5:
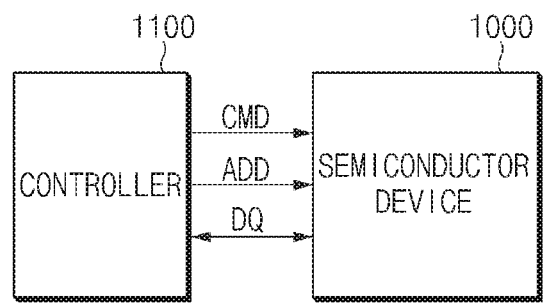
FIG. 5 is a configuration diagram of a semiconductor system according to an embodiment.

FIG. 5 is a configuration diagram of a semiconductor system according to an embodiment.

As illustrated in FIG. 5, the memory system may include a semiconductor device 1000 and a controller 1100. The controller 1100 applies a command signal CMD and an address ADD to the semiconductor device 1000, and controls operation of the semiconductor device 1000. The controller 1100 exchanges data DQ with the semiconductor device 1000 during a read or write operation.

The controller 1100 may transmit the command signals CMD to input an active command, a precharge command, a refresh command, a self refresh entry command, a self refresh exit command and a rupture command to the semiconductor device 1000.

The controller 1100 may transmit an address for selecting a cell block and a word line to activate or perform a rupture operation in the semiconductor device 1000 which transmits an active command ACT. The controller 1100 may periodically transmit a refresh command to the semiconductor device 1000, and transmit the self refresh entry command and the self refresh exit command in order to control the self refresh mode of the semiconductor device 1000. The controller 1100 may transmit a rupture command signal for controlling a rupture operation to the semiconductor device 1000 during a repair operation.

The semiconductor device 1000 may correspond to the memory described with reference to FIGS. 1, 2 and 4. The semiconductor device 1000 may detect the address of a high active word line. The semiconductor device 1000 may detect and store the address of the high active word line, and generate a target address. The semiconductor device 1000 may perform a target refresh operation using the target address whenever a predetermined number of refresh operations are performed during a normal refresh operation.

When entering the self refresh mode, the semiconductor device 1000 may periodically perform a refresh operation even though the refresh command REF is not received from the controller 1100.

The configuration and operation of the semiconductor device 1000 to perform rupture operations are the same as described with reference to FIGS. 1, 2 and 4. During a repair operation, the memory system may not, for example, perform a counting operation for a rupture address RADD during a period in which the rupture mask signal RUP_MASK is deactivated, thereby reducing the number of rupture operations.

According to the present embodiment, the rupture control device and the semiconductor device can minimize the time required for a rupture operation of a fuse.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A rupture control device comprising:
an address control circuit configured to generate a rupture address in response to a first rupture command signal, a rupture mask signal and an external address, wherein the rupture address is generated according to whether the rupture mask signal is activated, and wherein an address and fuse data are compared, and the rupture mask signal indicating whether a fuse is ruptured is determined; and
a fuse array configured to perform a rupture operation in response to the rupture address when a rupture enable signal is activated, and output the fuse data in response to a read enable signal,
wherein the address control circuit comprises:
a counter control circuit configured to output a counter control signal in response to the first rupture command signal and the rupture mask signal, and selectively activate the counter control signal according to whether the rupture mask signal is activated;
a rupture counter configured to output a counting signal in response to the counter control signal;
a rupture address generation circuit configured to generate the rupture address in response to the counting signal; and
a rupture control circuit configured to output the rupture enable signal in response to the rupture mask signal and a second rupture command signal,
wherein the rupture control circuit deactivates the rupture enable signal when the rupture mask signal is activated, regardless of the second rupture command signal.

2. The rupture control device of claim 1, further comprising:
a read control circuit configured to generate the read enable signal in response to the first rupture command signal.

3. The rupture control device of claim 1, wherein the counter control circuit activates the counter control signal when both of the first rupture command signal and the rupture mask signal are activated.

4. The rupture control device of claim 1, wherein when the counter control signal is deactivated, a counting operation of the rupture counter is stopped, and rupture operations are successively performed on the same rupture address.

5. The rupture control device of claim 1, wherein when the counting signal is deactivated, a preset number of rupture operations are performed on the same rupture address, until the rupture mask signal is activated.

6. The rupture control device of claim 1, wherein after a preset number of rupture operations are performed on the same rupture address during an inactive period of the rupture mask signal, a rupture operation is performed on the next rupture address.

7. The rupture control device of claim 1, wherein the fuse array comprises:
a plurality of cells in which a rupture operation for a fuse corresponding to the rupture address is performed when the rupture enable signal is activated;
a plurality of sense amplifiers configured to sense and output the fuse data when the read enable signal is activated; and
a plurality of latches configured to latch the rupture address.

8. The rupture control device of claim 7, wherein the plurality of cells comprise an ARE (Array Rupture Electrical fuse).

9. A semiconductor device comprising:
a rupture control device configured to output fuse data in response to a read enable signal, fix a counting signal during an inactive period of a rupture mask signal indicating whether a fuse is ruptured, and consecutively perform a preset number of rupture operations on the same rupture address; and
a normal cell array configured to perform a redundancy operation for a fail address during a repair operation in response to the fuse data,
wherein the rupture control device comprises:
an address control circuit configured to generate the rupture address in response to a first rupture command signal, the rupture mask signal and an external address, wherein the rupture address is generated according to whether the rupture mask signal is activated,
wherein the address control circuit comprises:
a counter control circuit configured to output a counter control signal in response to the first rupture command signal and the rupture mask signal, and selectively activate the counter control signal according to whether the rupture mask signal is activated;
a rupture counter configured to output the counting signal in response to the counter control signal;
a rupture address generation circuit configured to generate the rupture address in response to the counting signal; and
a rupture control circuit configured to output the rupture enable signal in response to the rupture mask signal and a second rupture command signal,
wherein the rupture control circuit deactivates the rupture enable signal when the rupture mask signal is activated, regardless of the second rupture command signal.

10. The semiconductor device of claim 9, wherein the rupture control device further comprising:
- a comparison circuit configured to compare an address and the fuse data, and output the rupture mask signal; and
- a fuse array configured to perform a rupture operation in response to the rupture address when a rupture enable signal is activated, and output the fuse data in response to the read enable signal.

11. The semiconductor device of claim 10, the rupture control device further comprises:
- a read control circuit configured to generate the read enable signal in response to the first rupture command signal.

12. The semiconductor device of claim 10, wherein the counter control circuit activates the counter control signal when both of the first rupture command signal and the rupture mask signal are activated.

13. The semiconductor device of claim 10, wherein when the counting signal is deactivated, a preset number of rupture operations are performed on the same rupture address, until the rupture mask signal is activated.

14. The semiconductor device of claim 10, wherein after a preset number of rupture operations are performed on the same rupture address during an inactive period of the rupture mask signal, a rupture operation is performed on the next rupture address.

15. The semiconductor device of claim 10, wherein the fuse array comprises:
- a plurality of cells in which a rupture operation for a fuse corresponding to the rupture address is performed when the rupture enable signal is activated;
- a plurality of sense amplifiers configured to sense and output the fuse data when the read enable signal is activated; and
- a plurality of latches configured to latch the rupture address.

16. The semiconductor device of claim 15, wherein the plurality of cells comprise an ARE (Array Rupture Electrical fuse).

* * * * *